US009515610B2

(12) United States Patent
Chang

(10) Patent No.: US 9,515,610 B2
(45) Date of Patent: Dec. 6, 2016

(54) LINE DRIVER WITH ACTIVE TERMINATION AND ASSOCIATED METHOD

(71) Applicant: MEDIATEK INC., Hsin-Chu (TW)

(72) Inventor: Wen-Hua Chang, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 70 days.

(21) Appl. No.: 14/572,752

(22) Filed: Dec. 16, 2014

(65) Prior Publication Data

US 2016/0173033 A1 Jun. 16, 2016

(51) Int. Cl.

| | |
|---|---|
| ***H03B 1/00*** | (2006.01) |
| ***H03K 3/00*** | (2006.01) |
| ***H03F 1/02*** | (2006.01) |
| ***H03F 1/56*** | (2006.01) |
| ***H03F 3/45*** | (2006.01) |

(52) U.S. Cl.

CPC .............. *H03F 1/0205* (2013.01); *H03F 1/56* (2013.01); *H03F 3/45076* (2013.01); *H03F 2203/45116* (2013.01); *H03F 2203/45336* (2013.01)

(58) Field of Classification Search

CPC ............... H03K 19/017509; H03F 3/19; H03F 3/45076; H03F 3/193; H03F 3/21; H04B 1/04

USPC .. 327/108–112, 427, 434, 437, 103; 326/82, 326/83, 87; 330/291, 296, 255, 260, 330/265

See application file for complete search history.

(56) References Cited

U.S. PATENT DOCUMENTS 5,585,763 A * 12/1996 Navabi ................. H03F 3/3001 330/255
8,022,736 B2 * 9/2011 Chang ................... H04L 25/028 327/108
2004/0165719 A1 * 8/2004 Gregorius ........... H04L 25/0266 379/377
2010/0039145 A1 * 2/2010 Wu .................... H03K 19/0185 327/108
2016/0087632 A1 * 3/2016 Fan .................. H03K 19/01750 327/103

* cited by examiner

*Primary Examiner* — Lincoln Donovan
*Assistant Examiner* — Thomas Skibinski
(74) *Attorney, Agent, or Firm* — Winston Hsu; Scott Margo

(57) ABSTRACT

A line driver and a method for driving a load are proposed. The line driver includes a current amplifier and a feedback network. The current amplifier has an input node arranged to receive an input current of the line driver, and an output node arranged to produce an output current. The feedback network is coupled between the input node and the output node of the current amplifier, wherein a portion of the output current of the line driver is guided to the feedback network, and an equivalent impedance obtained by looking into the output node of the current amplifier with the feedback network substantially equals an impedance of the load.

18 Claims, 9 Drawing Sheets

LINE DRIVER WITH ACTIVE TERMINATION AND ASSOCIATED METHOD

BACKGROUND

The disclosed embodiments of the present invention relate to wire line communication systems, and more particularly, to a line driver with active termination and an associated method.

In a conventional wire line communication system, a transmitter may need a local resistive termination with a certain value to operably match the source impedance to the channel characteristic impedance, in order to achieve maximum power transfer. When the transmitter is controlled to deliver signals to the subsequent wire line, the source impedance and load impedance will consume the same power. As a result, the efficiency of said transmitter is poor since half of the current is seized by the source impedance.

FIG. 1 is a diagram illustrating a conventional current mode DAC as a transmitter. A source impedance $R_S$ and a load impedance $R_L$ are arranged in a shunt configuration. FIG. 2 is a diagram illustrating a conventional voltage mode line driver as a transmitter. A source impedance $R_S$ and a load impedance $R_L$ are arranged in a series configuration. The amplitude of $V_{OX}$ is twice the amplitude of $V_O$. For the circuits shown in FIG. 1 and FIG. 2, the source impedance $R_S$ and the load impedance $R_L$ both consume the same power.

Some alternative designs have been proposed to reduce the power dissipated on source impedance, by employing a hybrid voltage mode and a current mode driver. The obvious shortcomings of such designs are higher hardware cost and lower operational speed. Hence, there is a need for an innovative design which can solve the above mentioned issues.

SUMMARY

One of the objectives of the present invention is to disclose a line driver with active termination and an associated method, to solve the issue.

According to a first aspect of the present invention, a line driver for driving a load is disclosed. The line driver comprises a current amplifier and a feedback network. The current amplifier has an input node arranged to receive an input current of the line driver, and an output node arranged to produce an output current. The feedback network is coupled between the input node and the output node of the current amplifier, wherein a portion of the output current of the line driver is guided to the feedback network, and an equivalent impedance obtained by looking into the output node of the current amplifier with the feedback network substantially equals an impedance of the load.

According to a second aspect of the present invention, a method for driving a load is disclosed. The method comprises: utilizing a current amplifier to receive an input current at an input node and produce an output current at an output node; and coupling a feedback network between the input node and the output node of the current amplifier to guide a portion of the output current generated from the output node of the output node; wherein the feedback network is configured to make an equivalent impedance obtained by looking into the output node of the current amplifier with the feedback network substantially equal to an impedance of the load.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

A wire line transmitter driver with active termination is disclosed, wherein the transmitter driver belongs to a current mode. The active termination is arranged for impedance matching and consumes much less power compared to the power dissipated on source impedance of the conventional during transmission. In other words, the current driver inherently has a characteristic to inject almost all the output current into the load impedance while retaining the same impedance match condition, thus reaching high power efficiency compared to the prior art.

Figure 1:
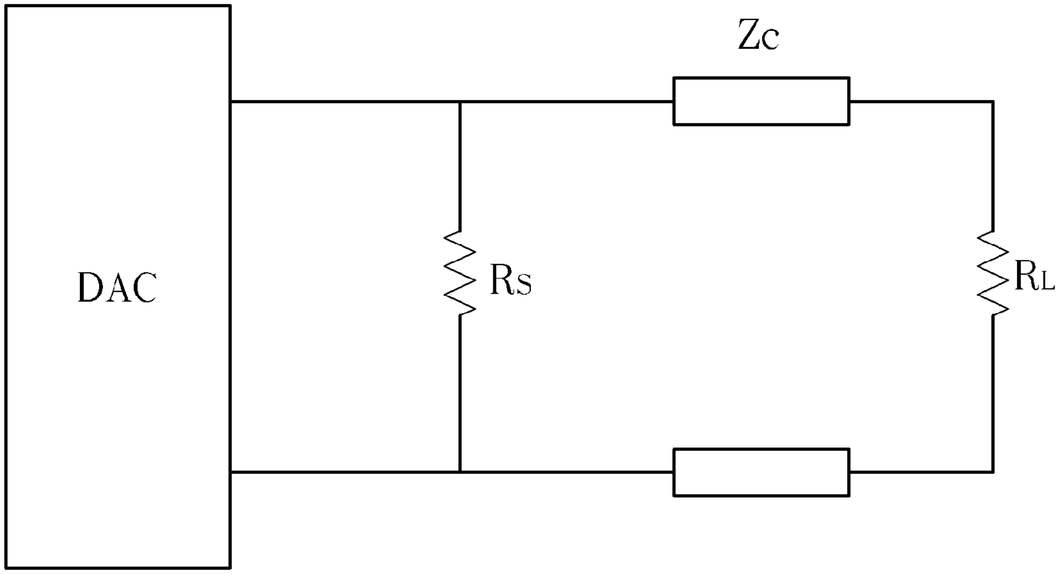
FIG. 1 is a diagram illustrating a conventional current mode DAC as a transmitter.
Figure 2:
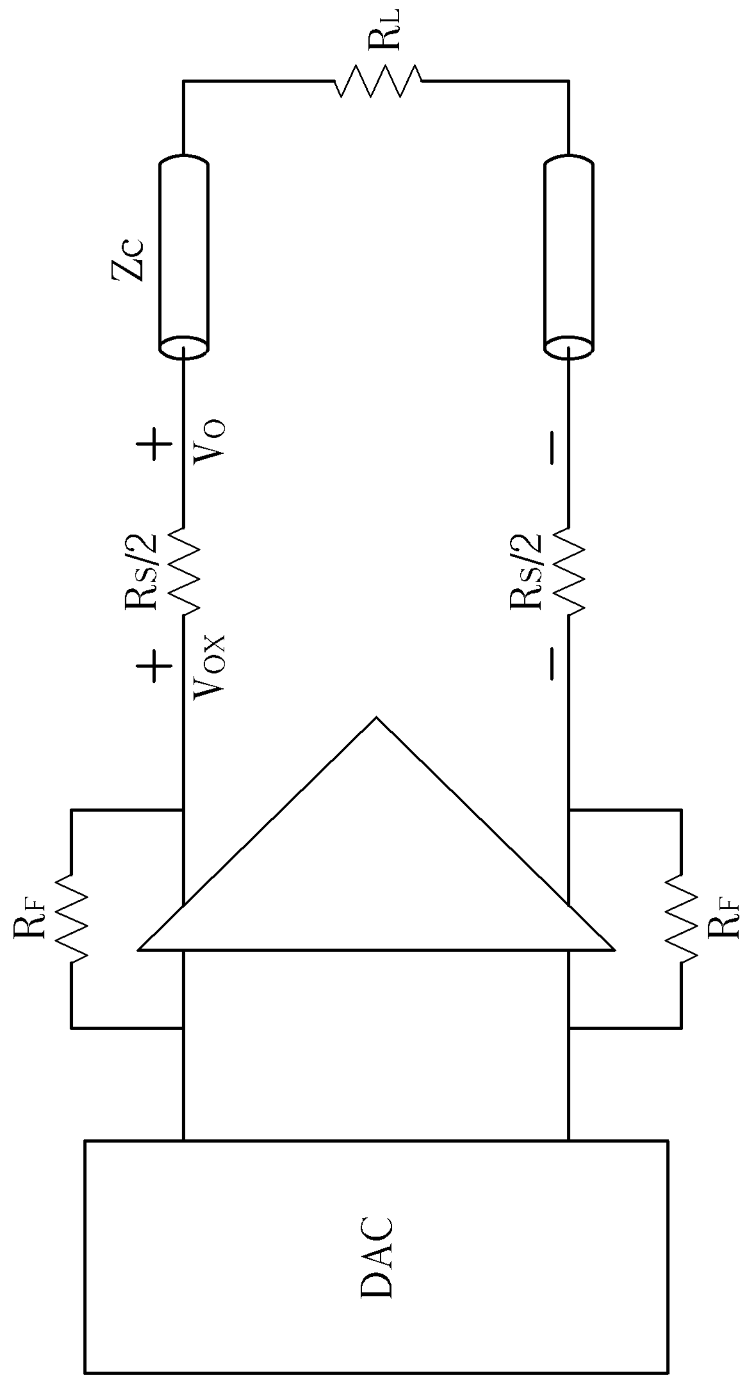
FIG. 2 is a diagram illustrating a conventional voltage mode line driver as a transmitter.
Figure 3:
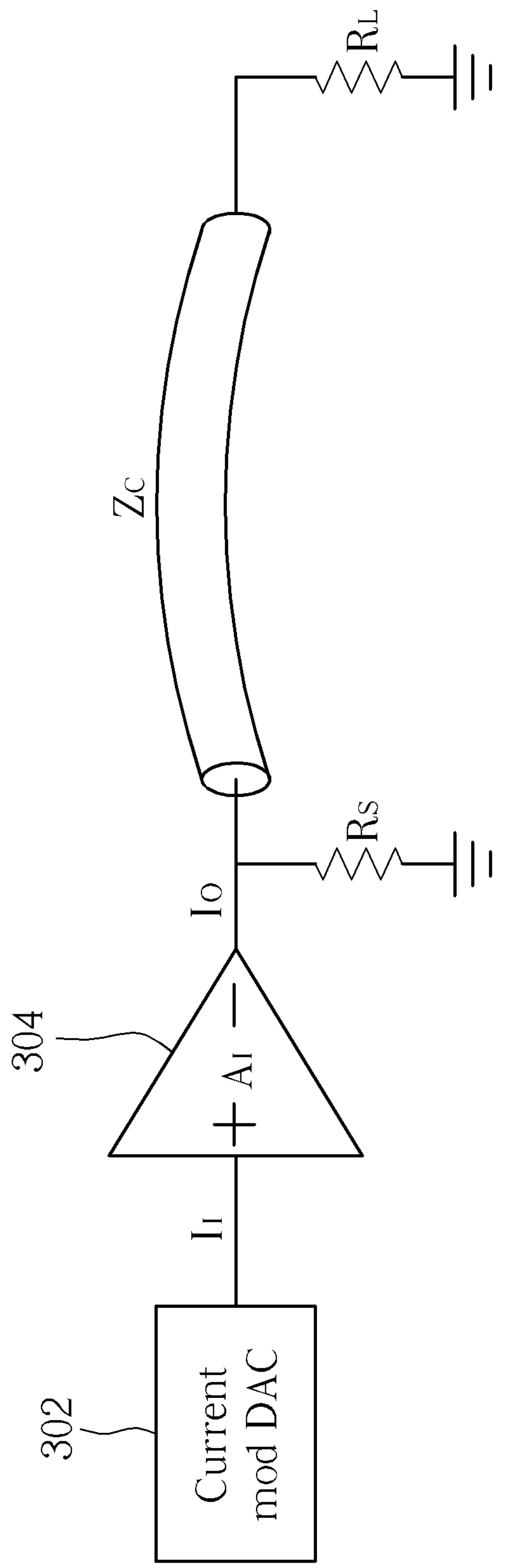
FIG. 3 is a diagram illustrating a current mode DAC subsequently followed by a single-ended current amplifier with a conventional source impedance arrangement.

Referring first to FIG. 3, an example block diagram of a current mode DAC (digital-to-analog converter) 302 subsequently followed by a single-ended current amplifier 304 with a conventional source impedance arrangement is shown. The source impedance arrangement may be equivalently described as a resistor $R_S$ between an output of the current amplifier 304 and a ground voltage. The current mode DAC 302 maybe operable to send input current $I_I$ to the current amplifier 304. The input current $I_I$ is then amplified by the current amplifier 304 to become output current $I_O=-A_I*I_I$, where $A_I$ is a current gain of the current amplifier 304. As mentioned above, half of the output current $I_O$ is dissipated on the resistor $R_S$ instead of being majorly injected into a resistor $R_L$ representing a load.

Figure 4:
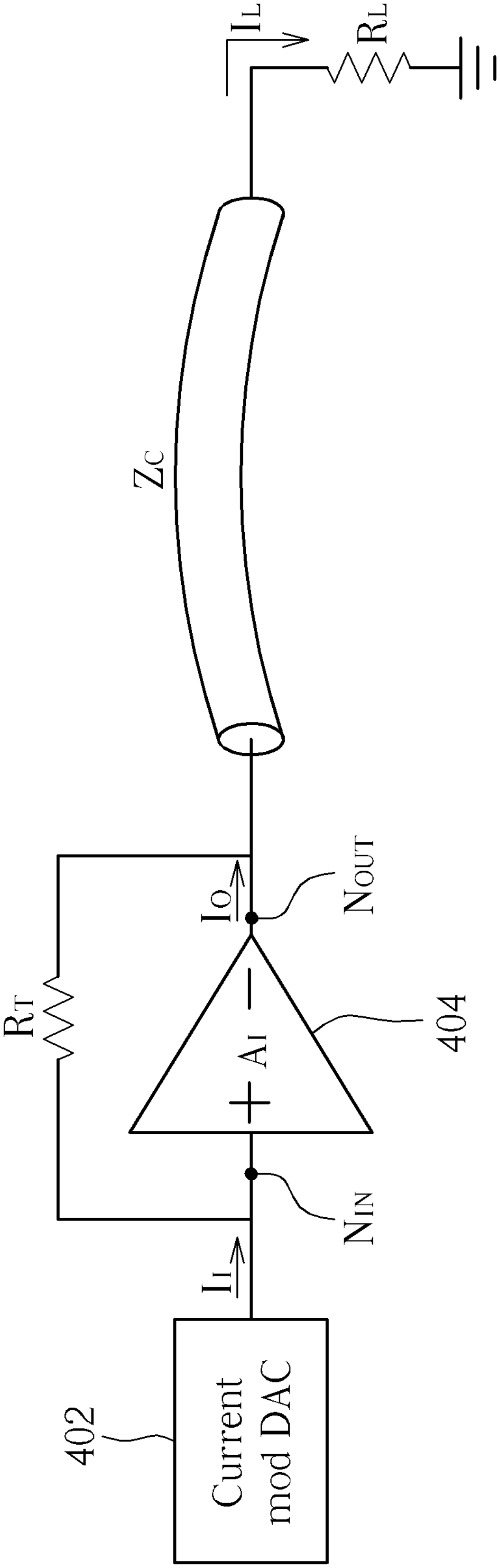
FIG. 4 is a diagram illustrating a current mode DAC subsequently followed by a single-ended current amplifier with an active termination according to an embodiment of the present invention.

Referring to FIG. 4, an example block diagram of a current mode DAC 402 subsequently followed by a single-ended current amplifier 404 with an active termination is shown, in accordance with an example embodiment of the invention. As shown in FIG. 4, a resistor $R_T$ is coupled between an output node $N_{OUT}$ and an input node $N_{IN}$ of the current amplifier 404. When $$R_T=R_S\cdot(1+A_I) \quad (1),$$

an output impedance of the current driver 404 will be equivalent to the resistor Rs of FIG. 3, where $A_I$ is a current gain of the current amplifier 404. According to equation (1), the current gain $A_I$ of the current amplifier 404 may be configured to be a large value, which enlarges the required resistor $R_T$. When the resistor $R_T$ is much greater than a resistor $R_L$ representing a load, almost all the output current Io will flow into the load resistor $R_L$. The specific deduction associated with equation (1) is provided hereinafter in greater detail.

When applying a voltage ($V_X$) at the output node $N_{out}$ of the current amplifier 404, an output current Ix of the current amplifier 404 can be described as:

$$I_X=\frac{V_X}{R_T}+\frac{V_X}{R_T}\cdot A_I=\frac{V_X(1+A_I)}{R_T}. \quad (2)$$

So, the output impedance of the current driver 404 is:

$$\frac{V_X}{I_X}=\frac{R_T}{1+A_I}. \quad (3)$$

When equation (1) is satisfied, the output impedance of the current driver 404 is obviously forced to be equivalent to the resistor $R_S$ of FIG. 3, so that impedance matching can be achieved. The derivations of equations involving the input current $I_I$, output current $I_O$, and output voltage $V_O$ of the current driver 404, and the resistor $R_T$ will be described later.

The impedance $R_T$ and the impedance $R_L$ are equivalently arranged in a shunt configuration, so $$V_O=I_O\cdot(R_T//R_L) \quad (4).$$

As mentioned above, $$R_L=R_S \quad (5)$$

for impedance matching. In addition, the output current $I_O$ contains the original input current $I_I$ part and the feedback current part. The output current $I_O$ can be represented as $$I_O=-A_I\left(\frac{V_O}{R_T}+I_I\right), \quad (6)$$

wherein the left value in parentheses is the feedback current passing through the impedance RT from the output node $N_{OUT}$ of the current driver 404 to the input node $N_{IN}$ of the current driver 404. According to equations (1) and (4)-(5), it can be derived that $$V_O=I_O\frac{(1+A_I)R_S}{2+A_I}. \quad (7)$$

According to equations (1) and (6), it can be derived that $$I_O=-A_I\left(\frac{V_O}{R_S\cdot(1+A_I)}+I_I\right). \quad (8)$$

And $$I_L=I_O-\frac{V_O}{R_T}, \quad (9)$$

wherein $I_L$ is current passing through the load impedance $R_L$. Therefore, $$I_L=\frac{-(2+A_I)A_I}{1+A_1}I_I-\frac{-A_IR_S}{2(1+A_I)R_S}I_I=\frac{-(2+A_I)A_I}{1+A_I}I_I+\frac{A_I}{2(1+A_I)}=\frac{-\left(\frac{3A_I}{2}+A_I\right)}{1+A_I}I_I. \quad (10)$$

It is obvious that the current $I_L$ will be less than, but close to, $I_O$ when the current gain $A_I$ of the current driver 404 is specified as a large value. The power efficiency can therefore be greatly improved by utilizing a current driver with a large current gain.

Figure 5:
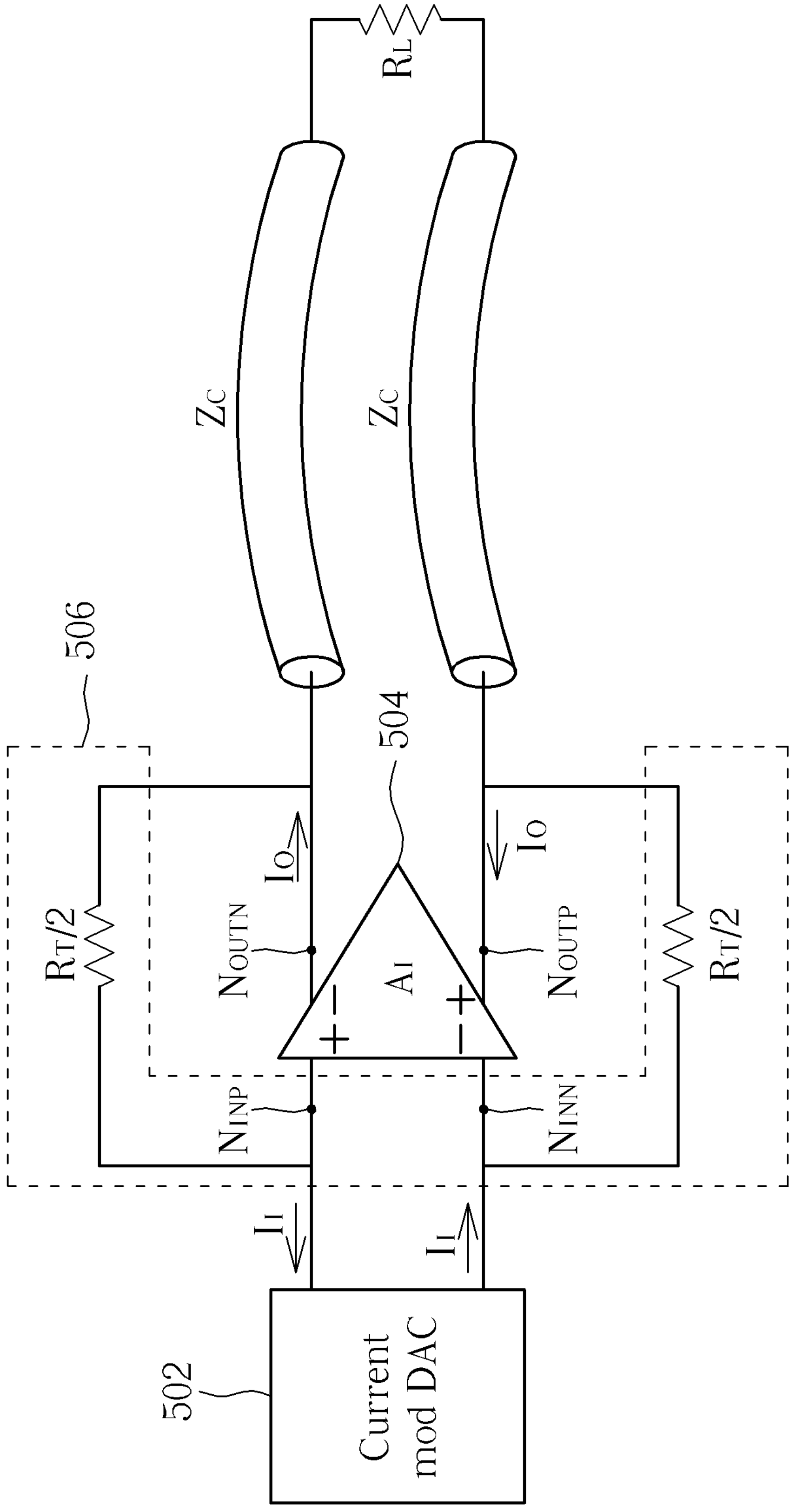
FIG. 5 is a diagram illustrating a current mode DAC subsequently followed by a differential current amplifier with an active termination according to an embodiment of the present invention.

Referring now to FIG. 5, an example block diagram of a current mode DAC 502 subsequently followed by a differential current amplifier 504 with an active termination is shown, in accordance with an exemplary embodiment of the invention. As shown in FIG. 5, the current amplifier 504 includes a positive input node $N_{INP}$ and a negative input node $N_{INN}$, and a positive output node $N_{OUTP}$ and a negative output node $N_{OUTN}$. A feedback network 506 includes a first feedback network circuit and a second feedback network circuit. The first feedback network circuit includes a resistor $R_T/2$ coupled between the negative output node $N_{OUTN}$ and a positive input node $N_{INP}$ of the current amplifier 504, and another resistor $R_T/2$ is coupled between a positive output node $N_{OUTP}$ and a negative input node $N_{INN}$ of the current amplifier 504. The same equation can be derived for the fully differential architecture in FIG. 5 by a similar deduction sequence, and thus the details are omitted here for brevity.

Figure 6:
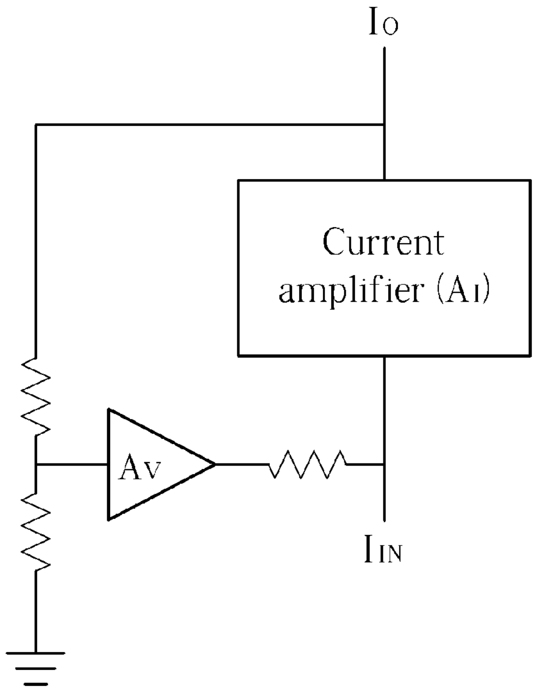
FIG. 6 is a diagram illustrating a line driver with a feedback network comprising another current amplifier and a voltage divider according to an embodiment of the present invention.
Figure 7:
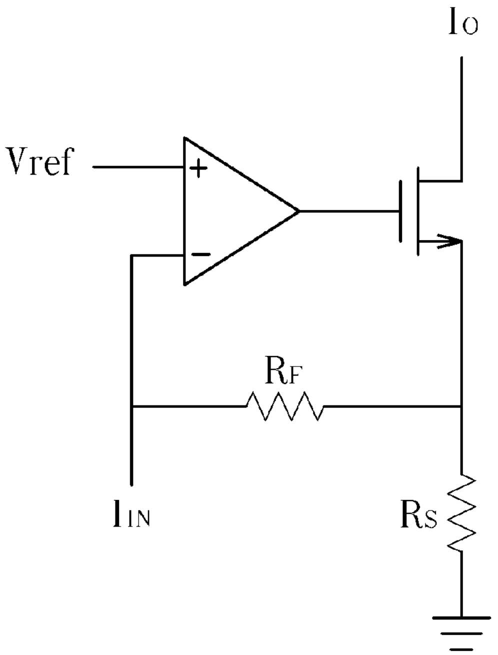
FIG. 7 is a diagram illustrating a line driver with a current amplifier of a first type according to an embodiment of the present invention.
Figure 8:
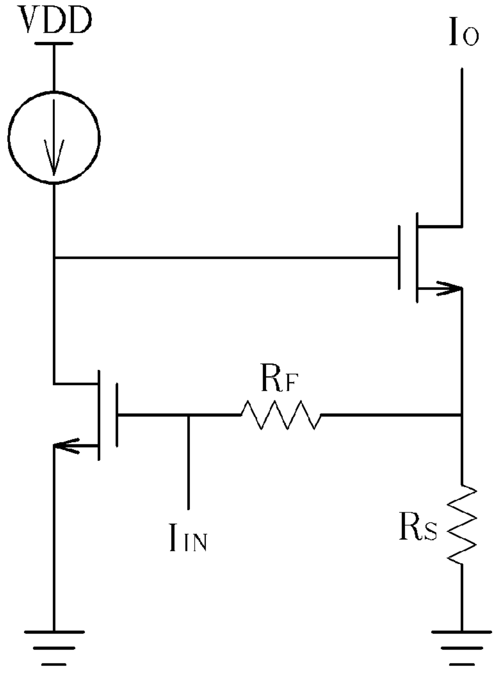
FIG. 8 is a diagram illustrating a line driver with a current amplifier of a second type according to an embodiment of the present invention.
Figure 9:
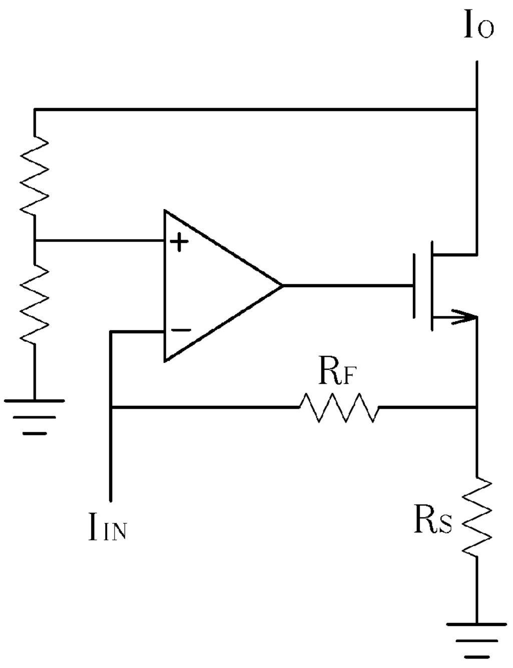
FIG. 9 is a diagram illustrating a line driver modified from FIG. 7.
Figure 10:
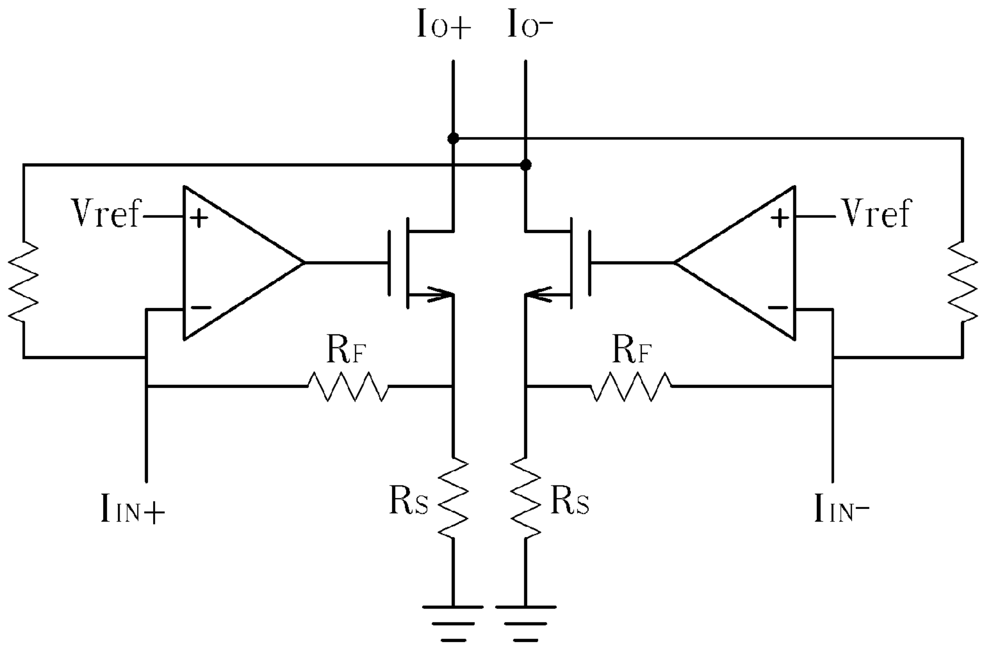
FIG. 10 is a diagram illustrating a differential line driver modified from FIG. 7.
Figure 11:
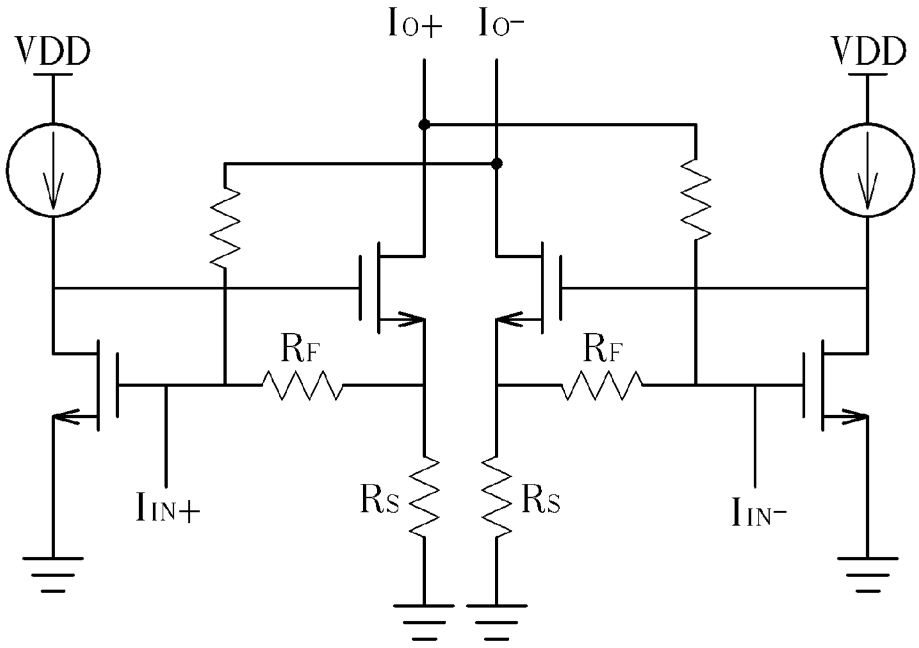
FIG. 11 is a diagram illustrating a differential line driver modified from FIG. 8.

Although so far the embodiments all employ pure passive components (e.g. a resistor) as the feedback network, active components, such as a voltage buffer, may also be utilized for implementation of the feedback network. Such alternative designs are shown in FIGS. 6-11. The design considerations of the feedback networks in FIGS. 6-11 are also based on the concept mentioned above. In FIG. 6, an example block diagram of a line driver with a feedback network comprising another current amplifier and a voltage divider is shown. In FIG. 7, an example block diagram of a line driver with a current amplifier of a first type is shown, where the current amplifier comprises an operational amplifier. In FIG. 8, an example block diagram of a line driver with a current amplifier of a second type is shown, where the current amplifier comprises a current source. In FIG. 9, an example block diagram of a line driver modified from FIG. 7 is shown. In FIG. 10, an example block diagram of a differential line driver modified from FIG. 7 is shown. In FIG. 11, an example block diagram of a differential line driver modified from FIG. 8 is shown. Those skilled in the art should readily understand the operations of examples shown in FIGS. 6-11; details are omitted here for brevity.

Figure 12:
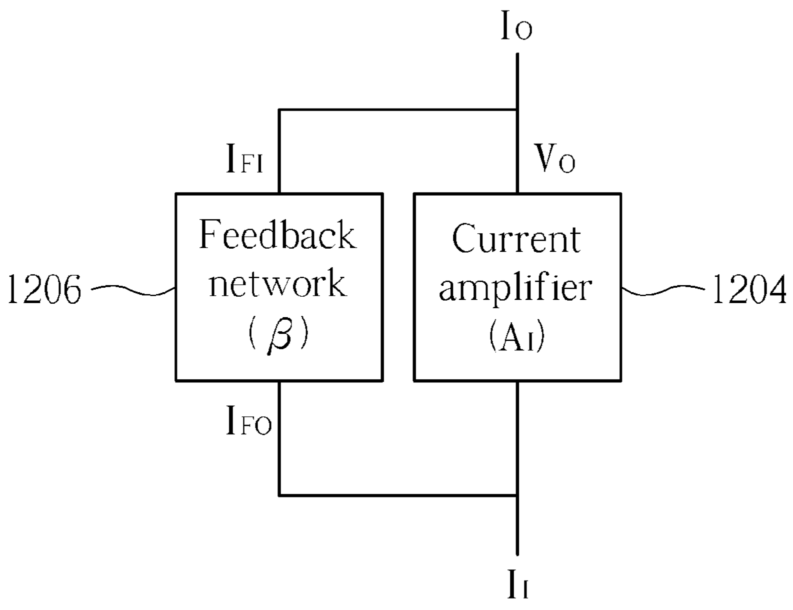
FIG. 12 is a diagram illustrating a conceptual single-ended active termination design according to an embodiment of the present invention.

More generally, the concept of the invention may be further summarized into a current amplifier combining with a feedback network, where the feedback network is configured as a negative feedback configuration. FIG. 12 is a diagram illustrating a conceptual single-ended active termination design according to an embodiment of the present invention. $A_I$ is a current gain of a single-ended current amplifier 1204, and β is equivalent impedance of a feedback network 1206 of FIG. 12. $I_{FI}$ is the current fed into the feedback network 1206, and $I_{FO}$ is the current output from the feedback network 1206. Equivalent impedance β can be represented as:

$$\beta = \frac{V_O}{I_{FO}}. \tag{11}$$

A current ratio α of the feedback network 1206 can be represented as:

$$\alpha = \frac{I_{FO}}{I_{FI}}. \tag{12}$$

In summary, when the feedback network 1206 satisfies $$\beta = R_S\left(A_I + \frac{1}{\alpha}\right), \tag{13}$$

the output impedance of the current amplifier 1204 will be equal to a target impedance $R_S$, which is determined by the load impedance. In a case where the current ratio α equals 1, i.e. the current $I_{FI}$ fed into the feedback network 1206 equals the current $I_{FO}$ output from the feedback network 1206 (for example, when the feedback network 1206 is merely a passive resistor), equation (13) will be substantially the same as equation (1).

Figure 13:
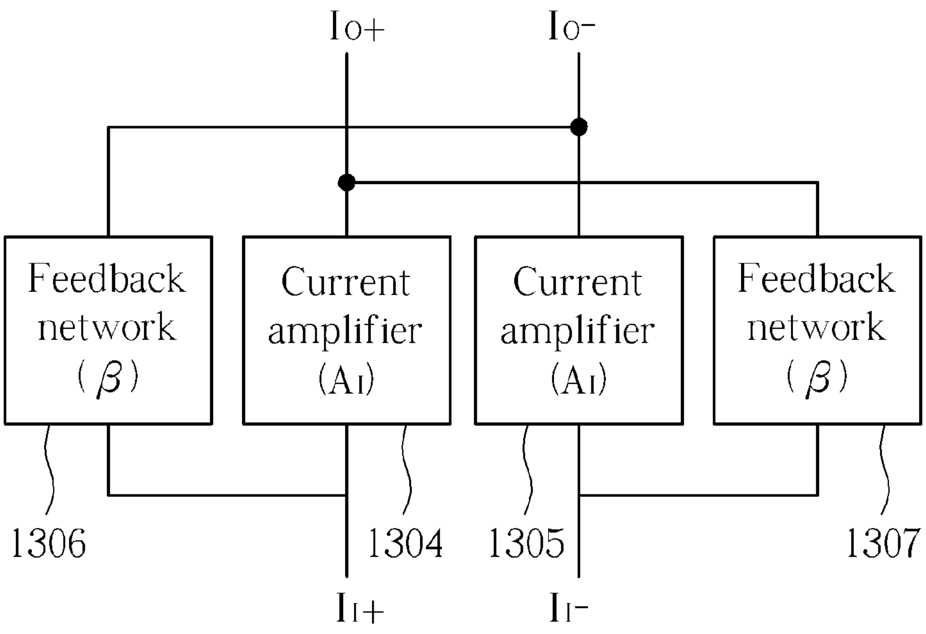
FIG. 13 is a diagram illustrating a conceptual differential active termination design according to an embodiment of the present invention.

FIG. 13 is a diagram illustrating a conceptual differential active termination design according to an embodiment of the present invention. For the fully differential current driver, the same result can be achieved by coupling a feedback network 1306 of a positive end to a negative output of a current amplifier 1305, and coupling a feedback network 1307 of a negative end to a positive output of a current amplifier 1304.

In particular, it is envisaged that the aforementioned inventive concept can be applied by a semiconductor manufacturer to any integrated circuit. It is further envisaged that, for example, a semiconductor manufacturer may employ the inventive concept in the design of a stand-alone device, or application-specific integrated circuit (ASIC) and/or any other sub-system element.

Aspects of the invention may be implemented in any suitable form including hardware, software, firmware or any combination of these. The invention may be implemented, at least partly, as computer software running on one or more data processors and/or digital signal processors or configurable module components such as FPGA devices. Thus, the elements and components of an embodiment of the invention may be physically, functionally and logically implemented in any suitable way. The functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor or controller. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved line driver has been described, wherein the aforementioned disadvantages with prior art arrangements have been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A line driver for driving a load, the line driver comprising:
- a current amplifier, having an input node arranged to receive an input current of the line driver, and an output node arranged to produce an output current; and
- a feedback network, coupled between the input node and the output node of the current amplifier, wherein a portion of the output current of the line driver is guided to the feedback network, and an equivalent impedance obtained by looking into the output node of the current amplifier with the feedback network substantially equals an impedance of the load;

wherein an impedance of the feedback network is set by RL·(A+1/α), wherein RL is the impedance of the load, A is a gain of the current amplifier, and α is a ratio of an output current generated from the feedback network to the input node of the current amplifier and an input current flowing from the output node of the current amplifier into the feedback network.

2. The line driver of claim 1, wherein the feedback network is a passive type.

3. The line driver of claim 2, wherein the feedback network comprises a resistor.

4. The line driver of claim 2, wherein α of the feedback network substantially equals 1.

5. The line driver of claim 1, wherein the feedback network is an active type.

6. The line driver of claim 5, wherein the feedback network comprises another current amplifier.

7. The line driver of claim 5, wherein α of the feedback network does not equal 1.

8. The line driver of claim 1, wherein the line driver is single-ended.

9. The line driver of claim 1, wherein the line driver is differential, the input node of the current amplifier includes a positive input node and a negative input node, the output node of the current amplifier includes a positive output node and a negative output node, and the feedback network comprises:

a first feedback circuit, coupled between the positive input node and the negative output node of the current amplifier; and a second feedback circuit, coupled between the negative input node and the positive output node of the current amplifier.

10. The line driver of claim 9, wherein a parameter α of the first feedback circuit and the second feedback circuit is substantially the same, where α is a ratio of an output current generated from the feedback circuit to the current amplifier and an input current flowing from the current amplifier into the feedback circuit.

11. The line driver of claim 1, wherein the current amplifier comprises an operational amplifier.

12. The line driver of claim 1, wherein the current amplifier comprises a current source.

13. A method for driving a load, comprising:

utilizing a current amplifier to receive an input current at an input node and produce an output current at an output node; and coupling a feedback network between the input node and the output node of the current amplifier to guide a portion of the output current generated from the output node;

wherein the feedback network is configured to make an equivalent impedance obtained by looking into the output node of the current amplifier with the feedback network substantially equal to an impedance of the load;

wherein an impedance of the feedback network is set by RL·(A+1/α), wherein RL is the impedance of the load, A is a gain of the current amplifier, and α is a ratio of an output current generated from the feedback network to the input node of the current amplifier and an input current flowing from the output node of the current amplifier into the feedback network.

14. The method of claim 13, wherein the feedback network is a passive type.

15. The method of claim 13, wherein the feedback network is an active type.

16. The method of claim 13, wherein the line driver is single-ended.

17. The method of claim 13, wherein the line driver is differential, the input node of the current amplifier includes a positive input node and a negative input node, the output node of the current amplifier includes a positive output node and a negative output node, and the step of coupling the feedback network between the input node and the output node of the current amplifier to guide the portion of the output current generated from the output node of the output node comprises:

coupling a first feedback circuit between the positive input node and the negative output node of the current amplifier; and coupling a second feedback circuit between the negative input node and the positive output node of the current amplifier.

18. The method of claim 17, wherein a parameter α of the first feedback circuit and the second feedback circuit is substantially the same, where α is a ratio of an output current generated from the feedback circuit to the current amplifier and an input current flowing from the current amplifier into the feedback circuit.

* * * * *